United States Patent
Nelson et al.

(10) Patent No.: US 6,552,618 B2
(45) Date of Patent: Apr. 22, 2003

(54) VCO GAIN SELF-CALIBRATION FOR LOW VOLTAGE PHASE LOCK-LOOP APPLICATIONS

(75) Inventors: Dale H. Nelson, Shillington, PA (US); Lizhong Sun, Emmaus, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/735,699

(22) Filed: Dec. 13, 2000

(65) Prior Publication Data

US 2002/0075080 A1 Jun. 20, 2002

(51) Int. Cl.[7] .............................................. H03L 7/087
(52) U.S. Cl. ........................... 331/11; 331/1 A; 331/17; 331/175; 331/177 R; 331/34
(58) Field of Search .............................. 331/17, 1 A, 11, 331/34, 175, 177 R

(56) References Cited

U.S. PATENT DOCUMENTS

| | | | |
|---|---|---|---|
| 5,382,922 A | * | 1/1995 | Gersbach et al. ........... 331/1 A |
| 5,942,949 A | | 8/1999 | Wilson et al. |
| 6,114,920 A | | 9/2000 | Moon et al. ................ 331/179 |

\* cited by examiner

Primary Examiner—Arnold Kinkead
(74) Attorney, Agent, or Firm—Duane Morris LLP

(57) ABSTRACT

A phase-locked loop (PLL) circuit having a voltage-controlled oscillator (VCO) is automatically calibrated for VCO center frequency and VCO gain during power up or responsive to a calibration signal. The VCO has several input voltage versus output frequency operating curves. During a calibration phase, proper VCO center frequency is selected by selecting one of the operating curves. VCO gain is then determined using the selected VCO operating curve. If the value of VCO gain is not within predetermined limits, VCO gain is adjusted accordingly, and the process of selecting a VCO operating curve and determining VCO gain is repeated.

19 Claims, 6 Drawing Sheets

VCO GAIN SELF-CALIBRATION FOR LOW VOLTAGE PHASE LOCK-LOOP APPLICATIONS

FIELD OF THE INVENTION

The present invention relates to electronics, and specifically to phase-lock loop circuits.

BACKGROUND OF THE INVENTION

A phase-lock loop (PLL) is a circuit that generates a periodic output signal having a constant phase relationship with respect to a periodic input signal. PLLs are widely used in many types of measurement, microprocessor, and communication applications. A typical PLL incorporates a voltage-controlled oscillator (VCO). A VCO is a device that generates a periodic output signal having a frequency that is a function of the VCO input voltage. VCOs are typically designed to operate over a wide range of application frequencies, and over a wide range of process and temperature variation. Of particular interest are the VCO operating characteristics of frequency range and gain.

In order to span a wide range of operating frequencies, a common practice is to increase VCO gain, $K_O$. However, the larger the $K_O$, the larger the sensitivity of the VCO to its input modulation noise, which includes charge pump noise, loop filter noise, and ripple noise. The ripple noise is due to the possible mismatching between the charge pump up and down currents and the charge sharing effect. PLL jitter can be reduced by decreasing the gain of the VCO, $K_O$, while increasing the charge pump current at the same time, if charge pump up and down currents are well matched.

One approach of reducing $K_O$ while at the same time spanning a wide frequency range is to break a wide range tuning curve into a number of narrower, overlapping range sections as described in U.S. Pat. No. 5,942,949, issued to Wilson et al. However, in deep submicron processes, the VCO gain can have a relatively high dependence on the process due to the variation in resistor, capacitor and transistor threshold voltages. Based on a simulation, it has been shown that $K_O$ can vary over processing by a factor of 8:1. The variation is also greatly influenced by the VCO structure and targeted frequency range. The conventional center frequency auto-calibration scheme, as described in U.S. Pat. No. 5,942,949, fails to limit the variation of $K_O$ caused by the process variation and by the frequency range over which it operates. This $K_O$ variation problem may degrade the loop stability margin and jitter performance.

SUMMARY OF THE INVENTION

The present invention includes a process for calibrating gain of a voltage-controlled oscillator (VCO) in a phase-locked loop (PLL) circuit. The VCO has a plurality of input voltage versus output frequency operating curves. The method includes a selecting one of the VCO operating curves and determining VCO gain using the selected operating curve. If the value of VCO gain is not within a predetermined range, the VCO gain is adjusted and the process of selecting an operating curve and determining VCO gain is repeated.

Another aspect of the present invention includes a PLL circuit having a VCO. The VCO receives a loop-filter voltage signal and provides a PLL output signal. The VCO also has a VCO gain and a VCO center frequency which are automatically calibrated during a calibration phase.

BRIEF DESCRIPTION OF THE DRAWINGS

The invention is best understood from the following detailed description when read in connection with the accompanying drawing. The various features of the drawings are not to scale. On the contrary, the dimensions of the various features may arbitrarily be expanded or reduced for clarity. Included in the drawing are the following figures.

DETAILED DESCRIPTION

Figure 1:
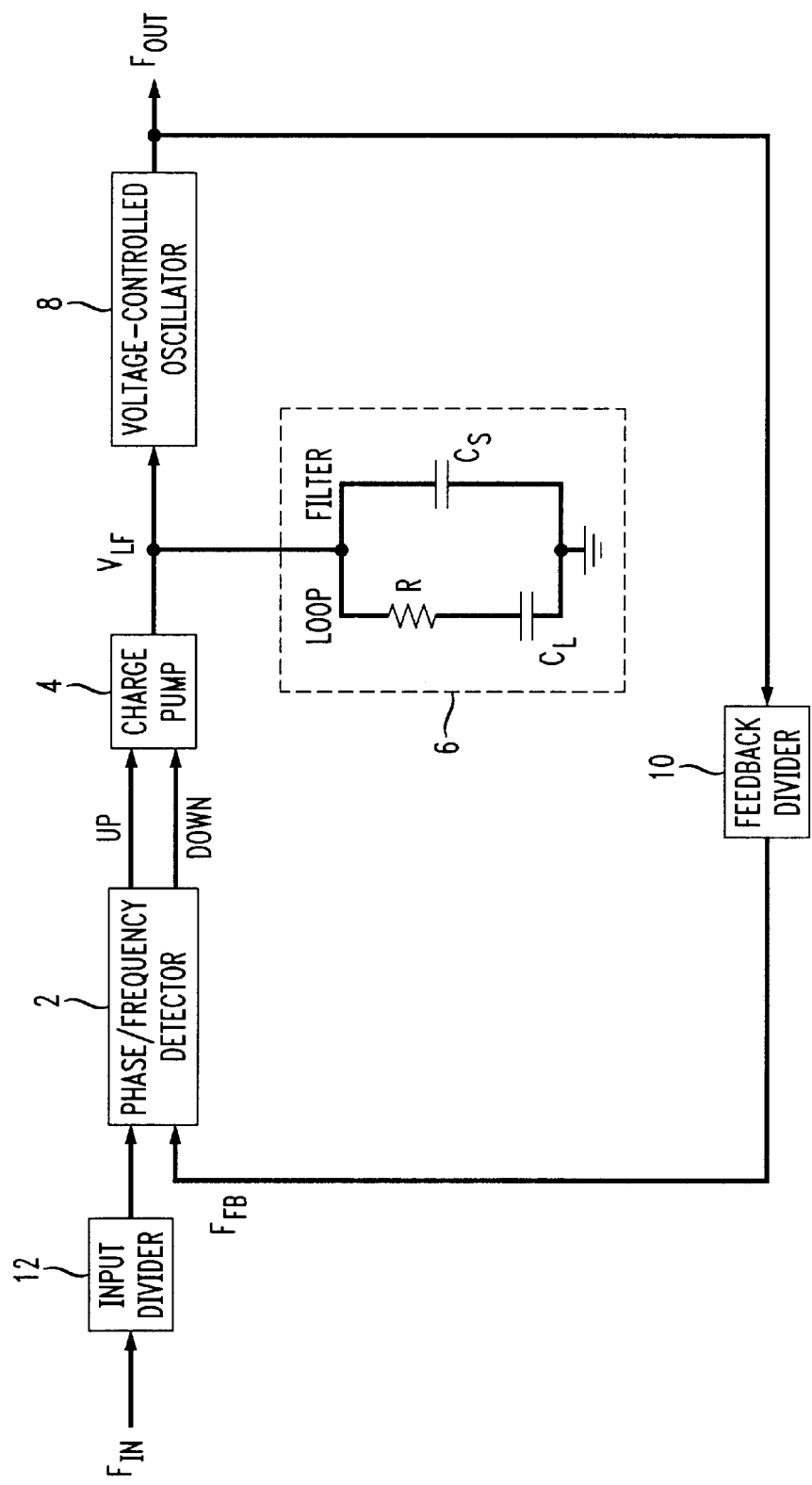
FIG. 1 (Prior Art) is a functional block diagram of a conventional charge-pump phase-lock loop (PLL)

FIG. 1 is a functional block diagram of a conventional charge-pump phase-lock loop (PLL). Phase/frequency detector (PFD) 2 compares the phase of the input signal, $F_{IN}$ to the phase of the feedback signal $F_{FB}$ and generates an error signal. The error signal is either an up signal or a down signal. An up signal indicate that the phase of $F_{IN}$ leads the phase of $F_{FB}$. A down signal indicates that the phase of $F_{FB}$ leads the phase of $F_{IN}$. The width of the error signal pulse indicates the magnitude of the difference between the phase of $F_{IN}$ and the phase of $F_{FB}$.

Charge pump 4 generates an amount of charge equivalent (in magnitude and polarity) to the error signal provided by PFD 2. Depending upon the polarity of the error signal (up or down), the charge is either added to or subtracted from the capacitors in loop filter 6. Loop filter 6 operates as an integrator that accumulates the net charge from charge pump 4. Loop filter 6 is exemplary, other, more sophisticated loop filters are also possible. The resulting loop_filter voltage, $V_{LF}$, is applied to voltage controlled oscillator (VCO) 8. PLL output signal, $F_{OUT}$, is used to generate the feedback signal, $F_{FB}$, for the PLL circuit in FIG. 1.

Optionally, feedback divider 10 and input divider 12 may be placed in the feedback and input paths, respectively, if the frequency of the output signal, $F_{OUT}$, is to be either a fraction or a multiple of the frequency of the input signal, $F_{IN}$. The divide by value is a real number, thus, if no division is desired, a divide by value of one is implemented.

It is emphasized that the present invention is not limited to charge pump PLL's. Rather, the present invention may be implemented for almost any PLL having a phase/frequency detector, an integrating loop filter, and a VCO.

Figure 2A:
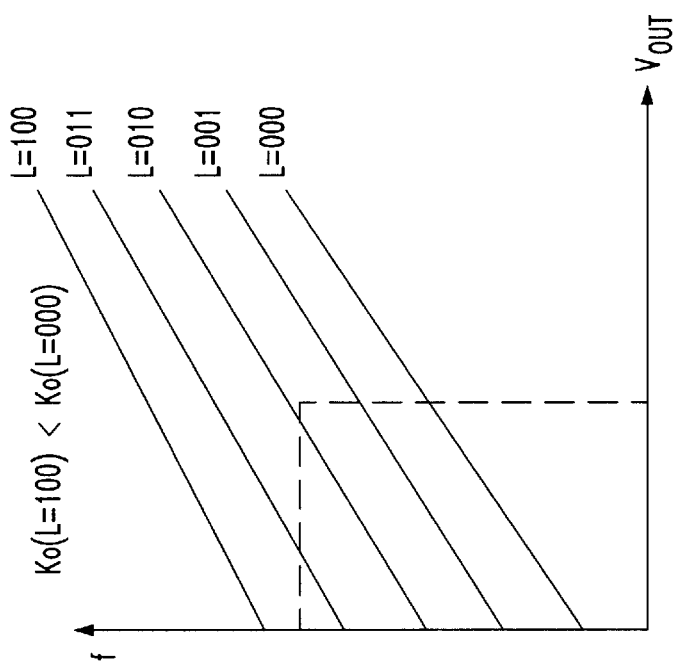
FIGS. 2A and 2B are graphs depicting exemplary sets of VCO operating curves.
Figure 2B:
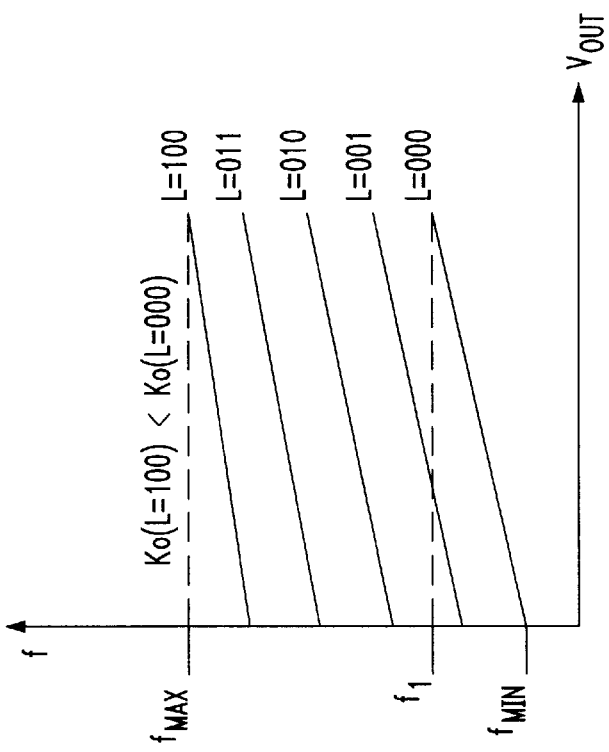

FIGS. 2A and 2B are graphs depicting exemplary sets of VCO operating curves. VCO's are often designed for a wide range of applications (e.g., wide range of frequencies and gain). Accordingly, VCO's are often have a number of operating curves (i.e., input voltage versus output frequency). The frequency range of any one curve is only a portion of the total operating range of the VCO. For example, the operating frequency range for the VCO depicted in FIG. 2A ranges form $f_{MIN}$ to $f_{MAX}$. Yet, the frequency range for the operating curve corresponding to L=000 ranges from $f_{MIN}$ to $f_1$. A center frequency control signal, L, is used to select one of the operating curves. The process of selecting a VCO operating curve is often referred to as trimming.

For low noise PLL applications, it is advantageous to implement a VCO with a relatively low gain. VCO gain, $K_O$, is defined as the ratio of output frequency over input voltage. Dividing values in hardware and software is well known in the art, accordingly determining VCO gain by dividing output frequency by input voltage may be accomplished by any such hardware or software technique. Relative gain may be determined by comparing the slopes of the operating curves. For example, the slopes of the set of operating curves in FIG. 2A is less than (i.e., less steep) the slopes of the set of operating curves in FIG. 2B, for all values of L. Thus, the gain of the VCO represented by FIG. 2B is greater than the gain of the VCO represented by FIG. 2A. Also, note that the VCO gain, $K_O$, may vary with the value of L for the same VCO. For example in FIG. 2B, $K_O$ for L=100 is less than $K_O$ for L=000. Further, it is not uncommon for a specific PLL application to be designed to operate within a specific frequency range. For example, an application may be designed to operate with a nominal output frequency of 100 MHz. This is accomplished by selecting a VCO operating curve having a center frequency close to the design nominal frequency.

A self trimming (i.e., self-calibrating) PLL circuit that automatically selects an appropriate VCO operating curve in order to meet operating frequency requirements, is described in U.S. Pat. No. 5,942,949 issued to Wilson et al. (hereinafter referred to as "Wilson et al."). The Wilson et al. patent does not address automatic self-calibration of VCO gain, $K_O$. As can be observed in FIGS. 2A and 2B, changing the value of L can also change the value of VCO gain, $K_O$.

Figure 3:
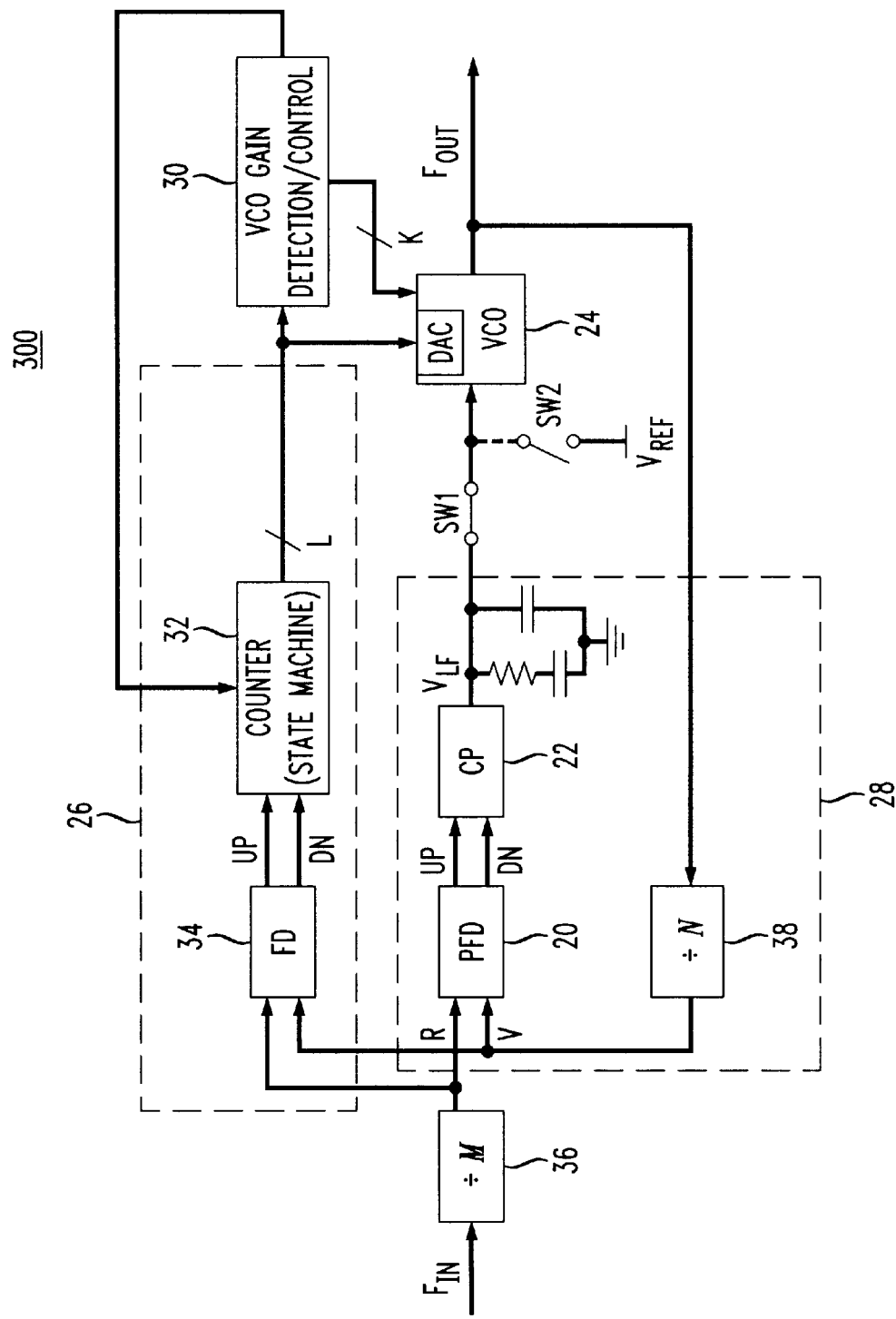
FIG. 3 is a functional block diagram of a self-calibrating PLL circuit in accordance with the present invention.

FIG. 3 is a functional block diagram of a self-calibrating PLL circuit in accordance with the present invention. The PLL circuit, generally designated 300, comprises phase/frequency detector 20, charge pump 22, VCO 24, input divider 36, and feedback divider 38, which are analogous to the corresponding components of the PLL in FIG. 1. Additionally, circuit 300 comprises VCO center frequency calibration portion 26, loop-filter portion 28, VCO gain calibration portion 30, and switches SW1 and SW2. Circuit 300 automatically calibrates VCO 24, during a calibration phase, by selecting an appropriate VCO operating curve and VCO gain, $K_O$. Automatic calibration may occur when the PLL is powered on, or at in response to a calibration trigger signal. The selected VCO operating curve and VCO gain, $K_O$, are used during normal operations.

During the calibration phase, switch SW1 is open and SW2 is closed. Accordingly, reference voltage, $V_{REF}$, is provided to VCO 24. During normal operations, SW1 is closed and SW2 is open, thus allowing loop-filter voltage, $V_{LF}$, to be applied to VCO 24. In one embodiment of the invention, the reference voltage, $V_{REF}$, is the nominal center of the range of input voltages over which VCO 24 is designed to operate. In alternate embodiments of the invention, the functions of switches SW1 and SW2 are incorporated inside the VCO and controlled by any appropriate control signal.

In operation, during the calibration phase, state machine 32 generates a sequence of VCO center frequency control signals, L, which is provided to VCO 24 to sequentially select different VCO operating curves. The sequence of VCO center frequency control signals, L, is also provide to VCO gain calibration portion 30. With reference voltage, $V_{REF}$, applied to VCO 24, for each VCO operating curve selected, VCO 24 generates an output signal, $F_{OUT}$, having a constant frequency. Output signal, $F_{OUT}$, is provided to frequency detector (FD) 34. FD 34 also receives the input signal from divider 36, R. FD 34 is analogous to PFD 20, except that FD 34 detects a difference in frequency rather than phase. Thus, FD 34 generates up and down error signals, which are accumulated by state machine 32. Because the frequency of $F_{OUT}$ provided to FD 34 is constant, FD 34 will eventually provide either a maximum up or down value to state machine 32, depending upon whether the frequency of the feedback signal, V, is greater than or less than the frequency of the input signal at the output of divider 36, R.

By purposefully selecting VCO center frequency control signals, L, state machine 32 may identify the two VCO operating curves that have center frequencies just above and just below the frequency of the input signal R. Either one of these two operating curves may be selected for use during normal PLL operations. In an exemplary embodiment of the invention, state machine 32 performs a linear search algorithm in which the values of the center frequency control value, L, are selected linearly starting at one end of the range of possible values (e.g., 0) and proceeding to the other end of the range until the error signal provided by FD 34 changes polarity. In an alternative embodiment of the invention, during step 58, a binary search algorithm is performed such that each new value of L is selected midway between two previously selected values that yielded opposing error signal values, until two consecutive values of L are detected that yield opposing error signal values.

After the first iteration of VCO center frequency calibration is completed, VCO gain, $K_O$ is calibrated. VCO center frequency signal, L, is provided to the VCO gain calibration portion 30. VCO gain calibration portion 30 uses this value of L to determine the value of VCO gain, $K_O$, for the corresponding operating curve. VCO gain, $K_O$, is determined by comparing L to a preset corresponding value of $K_O$. Thus, VCO gain calibration portion 30 is programmed with corresponding values of L and $K_O$ for determining if $K_O$ is within a desired range. If the value of $K_O$ is not within preset limits, VCO gain calibration portion 30 provides VCO 24 with a VCO gain calibration signal, K for adjusting $K_O$. When $K_O$ changes, the center frequency also changes, thus center frequency calibration is then restarted using the latest value of K. The process is repeated until satisfactory values of L and $K_O$ are obtained.

Once the calibration phase is complete, switches SW1 is closed and SW2 is opened to enable normal PLL operations using the VCO operating curve and value of VCO gain selected during the calibration phase.

In the embodiments of the invention described herein, signals L and K are digital signals, and VCO 24 comprises a digital to analog converter for converting L to an analog signal. In alternate embodiments of the invention, a digital to analog converter, separate from VCO 24, converts L to an analog signal prior to being provided to VCO 24.

Figure 4:
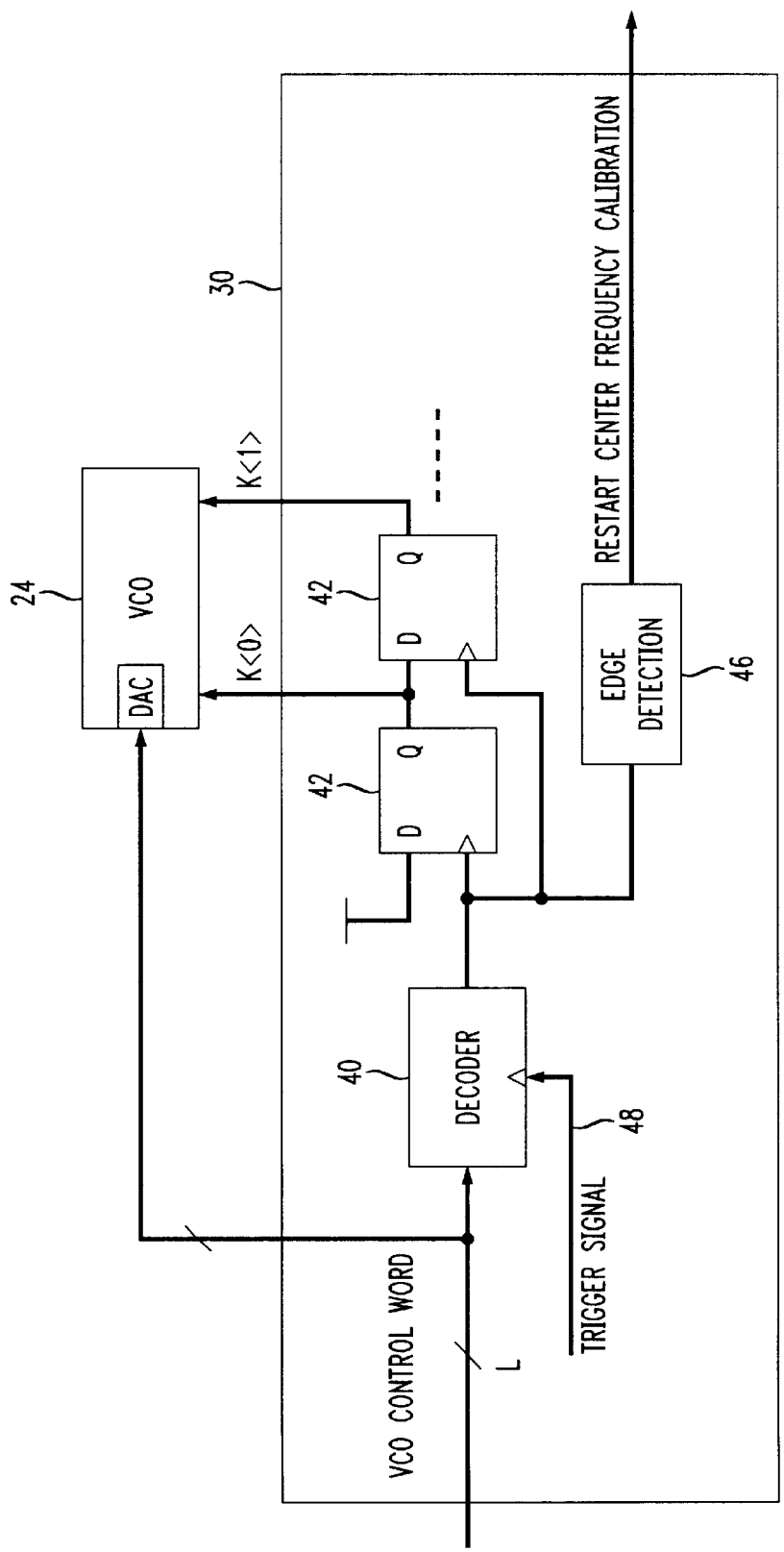
FIG. 4 is a functional block diagram of an exemplary embodiment of a VCO gain calibration portion of a phase-locked loop in accordance with the present invention.

FIG. 4 is a functional block diagram of an exemplary embodiment of a VCO gain calibration portion of a phase-locked loop in accordance with the present invention. Decoder 40 receives the VCO center frequency calibration signal, L. Upon receiving trigger signal 48, decoder 40 decodes L to determine if $K_O$ is within range. Trigger signal 48 indicates that an iteration of automatic VCO center frequency calibration has completed. Decoder 40 is preset with predetermined values of L which are used to determine if L is in range. Thus, for example, if a value of L indicates that $K_O$ is too high (by comparing to the preset values) decoder 40 provides D flip-flops 42 with a decoder output signal. This decoder output signal is also provided to edge detector 46. Responsive to the decoder output signal sent by decoder 40, edge detector 46 sends a restart signal to restart the VCO center frequency calibration process. Each time the D flip-flops 42 receive a decoder output signal from decoder 40, the value of K, which is sent to VCO 24, is incremented. K<0> corresponds to bit zero of the digital word K, and K<1> corresponds to bit one of the digital word K.

Figure 5:
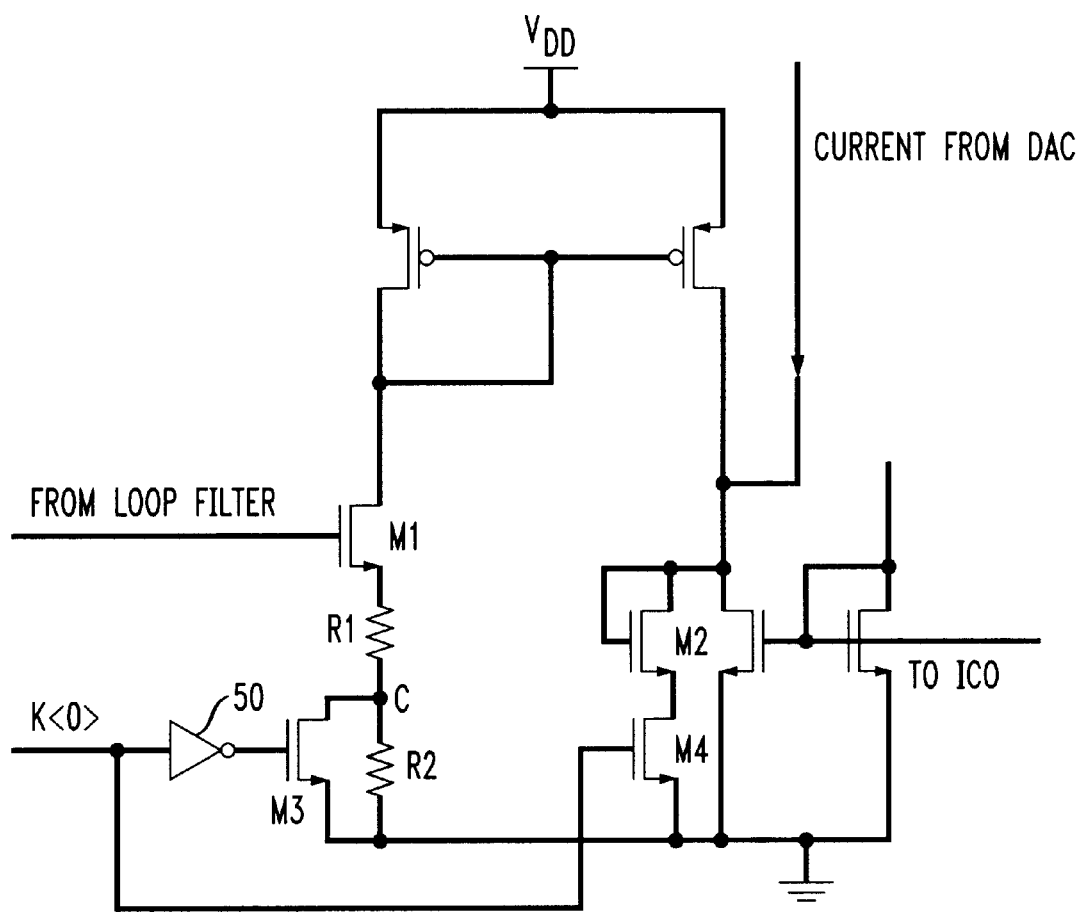
FIG. 5 is a circuit diagram of an exemplary embodiment of a voltage to current conversion portion of a VCO in accordance with the present invention.

Signal, K, adjusts the gain of the VCO 24. FIG. 5 is a circuit diagram of an exemplary embodiment of a voltage to current conversion portion of a VCO in accordance with the present invention. In FIG. 5, transistor, M1, and resistor, R1, provide voltage-controlled transconductance. The gain of a VCO is proportional to transconductance. When K<0> in FIG. 5 is equal to a digital value of one, inverter 50 provides a digital value of zero to transistor M3. This decreases the value of transconductance by increasing the resistance between node C and ground. Further, transistor M4 is turned on, which causes more current to flow through transistors M2 and M4 to ground. Therefore, less current is provided to the current-controlled oscillator (ICO) portion of VCO 24. Accordingly, the gain of VCO 24 is decreased. The circuit shown in FIG. 5 may be replicated to accommodate each bit of the digital word K.

Figure 6:
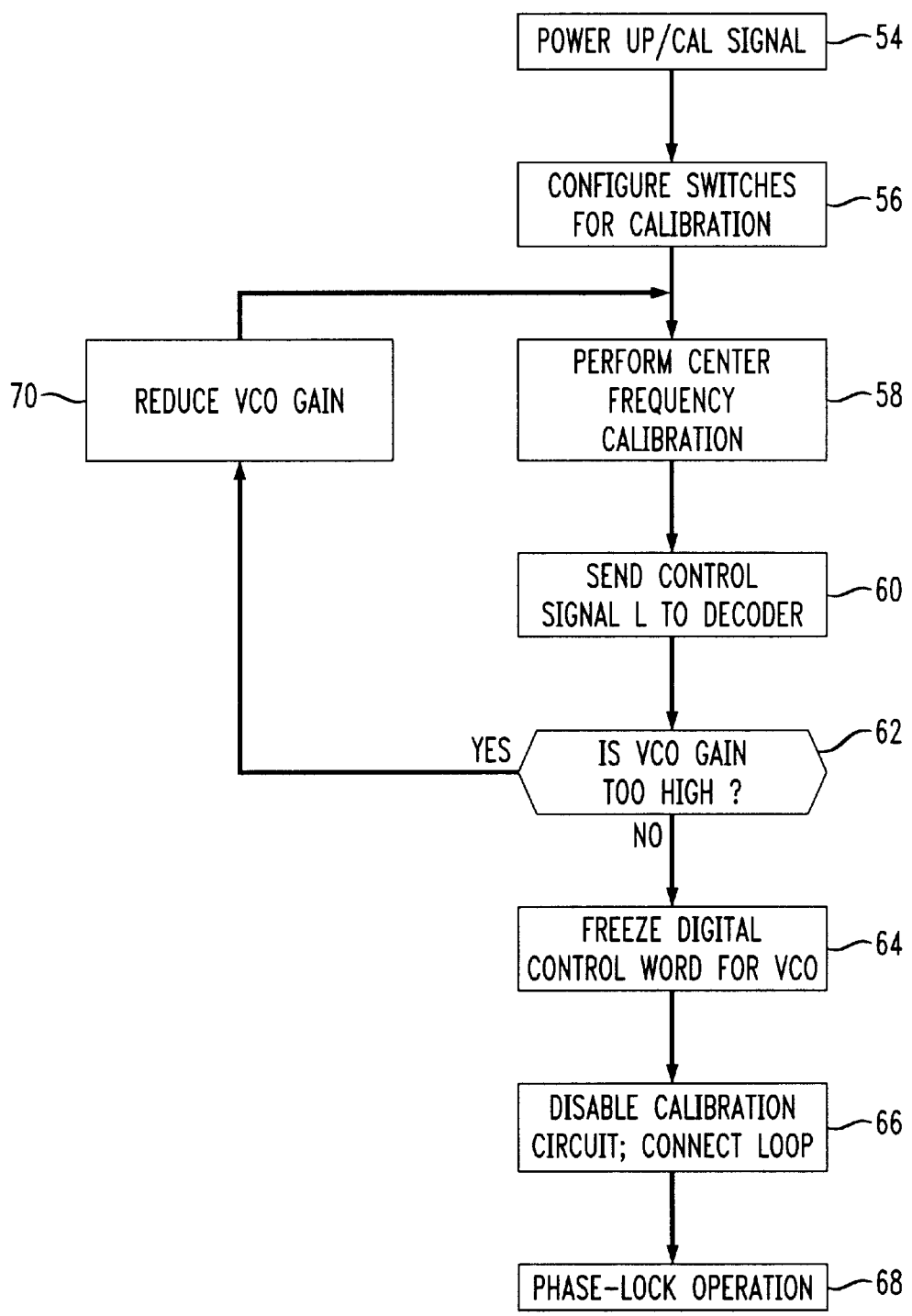
FIG. 6 is a flow diagram of an exemplary process for calibrating a PLL circuit in accordance with the present invention.

FIG. 6 is a flow diagram of an exemplary process for calibrating a PLL circuit in accordance with the present invention. The flow diagram in FIG. 6 is described with reference to FIGS. 3 and 4. At power up, or responsive to a calibration signal, as shown in step 54, VCO center frequency calibration is performed. During step 56, switches SW1 is opened and SW2 is closed. In this calibration switching configuration, $V_{REF}$ is provided to VCO 24.

VCO Center frequency calibration is performed in step 58. During this portion of the process, state machine 32 generates a sequence of VCO center frequency control signals, L, which is provided to VCO 24 to sequentially select different VCO operating curves. With reference voltage, $V_{REF}$, applied to VCO 24, for each VCO operating curve selected, VCO 24 generates an output signal, $F_{OUT}$, having a constant frequency. Output signal, $F_{OUT}$, is provided to frequency detector (FD) 34. FD 34 also receives the input signal from divider 36, R. FD 34 is analogous to PFD 20, except that FD 34 detects a difference in frequency rather than phase. Thus, FD 34 generates up and down error signals, which are accumulated by state machine 32. Because the frequency of $F_{OUT}$ provided to FD 34 is constant, FD 34 will eventually provide either a maximum up or down value to state machine 32, depending upon whether the frequency of the feedback signal, V, is greater than or less than the frequency of the input signal at the output of divider 36, R.

The desired frequency of the VCO output signal, $F_{OUT}$, is the frequency of the input signal R. By purposefully selecting VCO center frequency control signals, L, state machine 32 may identify the two VCO operating curves that have center frequencies just above and just below the frequency of the input signal R. Either one of these two operating curves may be selected for use during normal PLL operations. In an exemplary embodiment of the invention, state machine 32 performs a linear search algorithm in which the values of the center frequency control value, L, are selected linearly starting at one end of the range of possible values (e.g., 0) and proceeding to the other end of the range until the error signal provided by FD 34 changes polarity. In an alternative embodiment of the invention, state machine 32 performs a binary search algorithm such that each new value of L is selected midway between two previously selected values that yielded opposing error signal values, until two consecutive values of L are detected that yield opposing error signal values.

After the first iteration of VCO center frequency calibration is completed, the present value of the digital control word, L, is provided to the VCO gain calibration portion 30, in step 60. Digital control word, L, is received by decoder 40. This value of L is used to determine the value of VCO gain, $K_O$, for the corresponding operating curve. VCO gain, $K_O$, is determined by comparing L to a preset corresponding value of $K_O$. Thus, VCO decoder 40 is programmed with corresponding values of L and $K_O$ for determining if $K_O$ is within a desired range.

VCO gain is determined and compared with preset limits in step 62. As shown in steps 62 and 70, if the value of $K_O$ is above a threshold value, VCO gain is reduced. In an alternate embodiment of the invention, VCO gain is checked to determine if it is below a threshold value (i.e., too low), and increased accordingly. During step 70, VCO gain calibration portion 30 provides VCO 24 with a VCO gain calibration signal, K for adjusting $K_O$. Another iteration of VCO center frequency calibration is then performed as indicated in step 58. This process is repeated until satisfactory values of L and $K_O$ are obtained.

The values of L and VCO gain resulting from the calibration process are used during normal PLL operations, as indicated in step 64. Switches SW1 and SW2 are configured for normal operations, as indicated in step 66. That is, SW1 is closed and SW2 is opened. In step 68, the calibrated PLL circuit is in normal operation. Thus, loop-back voltage, $V_{LF}$, is provided to VCO 24.

The present invention provides advantages over the PLLs of the prior art because the VCO is calibrated automatically to the appropriate operating curve and gain at power up. Reducing VCO gain, $K_O$, variation through self-calibration helps maintain low variation in PLL bandwidth. This is important for stable loop dynamics. Reducing VCO gain also helps minimizes the output phase noise. In addition, because the VCO is not permanently calibrated, the PLL can be used for different applications operating at different nominal frequencies and gain values. Each time the PLL is powered up, the VCO will be calibrated to the current appropriate settings. In addition, the PLL automatic calibration operations may be repeated whenever an appropriate reset signal is applied to the PLL.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. A method for calibrating gain of a voltage controlled oscillator (VCO) in a phase-locked loop (PLL) circuit, said VCO having a plurality of input voltage versus output frequency operating curves, said method comprising the steps of:
   (a) selecting one of said plurality of VCO operating curves;
   (b) determining VCO gain using values of input voltage and output frequency corresponding to the selected VCO operating curve;

(c) comparing the determined VCO gain with predetermined values of VCO gain; and (d) if the determined VCO gain is not within the predetermined values of VCO gain, adjusting VCO gain by adjusting a transconductance of said VCO and repeating steps (a) through (c).

2. A method in accordance with claim 1, wherein said step of selecting one of said plurality of VCO operating curves comprises:

applying a sequence of digital control input values to said VCO, wherein each digital control input value corresponds to a different one of said plurality of VCO operating curves; and selecting one of said sequence of digital control input values responsive to a loop-filter voltage of said PLL circuit.

3. A method in accordance with claim 1, wherein said step of adjusting VCO gain comprises:

applying a sequence of gain digital control values to said VCO, wherein each gain digital control value corresponds to a different value of VCO gain; and selecting one of said gain digital control values responsive to said determined VCO gain.

4. A method in accordance with claim 3, wherein said step of selecting one of said gain digital control values comprises at least one of incrementing and decrementing said gain digital control value by a least significant bit.

5. An electronic circuit for calibrating gain of a voltage controlled oscillator (VCO) in a phase-locked loop (PLL) circuit, said VCO having a plurality of input voltage versus output frequency operating curves, said electronic circuit comprising:

(a) means for selecting one of said plurality of VCO operating curves;

(b) means for determining VCO gain using values of input voltage and output frequency corresponding to the selected VCO operating curve;

(c) means for comparing the determined VCO gain with predetermined values of VCO gain; and (d) if the determined VCO gain is not within the predetermined values of VCO gain, means for adjusting VCO gain by adjusting a transconductance of said VCO and repeating (a) through (c).

6. An electronic circuit in accordance with claim 5, wherein said means for selecting one of said plurality of VCO operating curves comprises:

means for applying a sequence of digital control input values to said VCO, wherein each digital control input value corresponds to a different one of said plurality of VCO operating curves; and means for selecting one of said sequence of digital control input values responsive to a loop-filter voltage of said PLL circuit.

7. An electronic circuit in accordance with claim 5, wherein said means for adjusting VCO gain comprises:

means for applying a sequence of gain digital control values to said VCO, wherein each gain digital control value corresponds to a different value of VCO gain; and means for selecting one of said gain digital control values responsive to said determined VCO gain.

8. An electronic circuit in accordance with claim 7, wherein said means for selecting one of said gain digital control values comprises at least one of incrementing and decrementing said gain digital control value by a least significant bit.

9. A phase-locked loop (PLL) circuit comprising a voltage controlled oscillator (VCO) for receiving a loop-filter voltage signal and providing a PLL output signal, said VCO having a VCO gain and a VCO center frequency, wherein said VCO gain and said VCO center frequency are automatically calibrated during a calibration phase, wherein calibrating said VCO gain comprises adjusting a transconductance of said VCO.

10. A PLL circuit in accordance with claim 9, wherein said PLL circuit is an integrated circuit.

11. A PLL circuit in accordance with claim 9 further comprising a switching configuration, wherein said loop-filter voltage signal is provided to said VCO during normal PLL operations, and a reference voltage is provided to said VCO during said calibration phase.

12. A PLL circuit in accordance with claim 9 further comprising a loop-filter portion for receiving said PLL output signal and an input signal, and for providing said loop-filter voltage signal responsive to a difference in phase between said input signal and a feedback signal, said feedback signal being equal to said PLL output signal divided by N, wherein N is a real number.

13. A PLL circuit in accordance with claim 12 further comprising a VCO center frequency calibration portion for receiving said input signal and said feedback signal, and for providing a center frequency control signal to said VCO for calibrating said VCO center frequency.

14. A PLL circuit in accordance with claim 13 further comprising a VCO gain calibration portion for receiving said center frequency control signal and providing a gain control signal to said VCO for calibrating said VCO gain.

15. A PLL circuit in accordance with claim 14, wherein said VCO gain calibration portion comprises:

a decoder for receiving a trigger signal and providing a decoder output signal; said trigger signal indicating the completion of an iteration of VCO center frequency calibration;

at least one flip flop for incrementing a value of VCO gain responsive to said decoder output signal; and a detector for receiving said decoder output signal and for providing a restart signal, wherein said restart signal initiates VCO center frequency calibration.

16. A PLL circuit in accordance with claim 14, wherein said VCO comprises a voltage to current conversion portion for adjusting a transconductance of said voltage to current conversion portion in response to said gain control signal.

17. An integrated circuit having a phase-locked loop (PLL) comprising:

a voltage controlled oscillator (VCO) for receiving a loop-filter voltage signal and providing a PLL output signal, said VCO having a plurality of input voltage versus output frequency operating curves, a VCO gain, and a VCO center frequency, wherein said VCO gain and said VCO center frequency are automatically calibrated during a calibration phase;

a switching configuration, wherein said loop-filter voltage signal is provided to said VCO during normal PLL operations, and a reference voltage is provided to said VCO during said calibration phase;

a loop-filter portion for receiving said PLL output signal and an input signal, and for providing said loop-filter voltage signal responsive to a difference in phase between said input signal and a feedback signal, said feedback signal being equal to said PLL output signal divided by N, wherein N is a real number;

a VCO center frequency calibration portion for receiving said input signal and said feedback signal, and for providing a sequence of center frequency control signals to said VCO for calibrating said VCO center frequency, wherein each one of said sequence of center frequency control signals corresponds to one of said plurality of VCO operating curves; and a VCO gain calibration portion for receiving said center frequency control signal and providing a sequence of gain control signals to said VCO for calibrating said VCO gain, wherein each one of said sequence of gain control signals corresponds to a different value of VCO gain.

18. A method for calibrating gain of a voltage controlled oscillator (VCO) in a phase-locked loop (PLL) circuit, said VCO having a plurality of input voltage versus output frequency operating curves, said method comprising the steps of:

(a) selecting one of said plurality of VCO operating curves;

(b) determining VCO gain using values of input voltage and output frequency corresponding to the selected VCO operating curve;

(c) comparing the determined VCO gain with predetermined values of VCO gain; and (d) if the determined VCO gain is not within the predetermined values of VCO gain:

applying a sequence of gain digital control values to said VCO, wherein each gain digital control value corresponds to a different value of VCO gain;

selecting one of said gain digital control values responsive to said determined VCO gain by at least one of incrementing and decrementing said gain digital control value by a least significant bit;

and repeating steps (a) through (c).

19. An electronic circuit for calibrating gain of a voltage controlled oscillator (VCO) in a phase-locked loop (PLL) circuit, said VCO having a plurality of input voltage versus output frequency operating curves, said electronic circuit comprising:

(a) means for selecting one of said plurality of VCO operating curves;

(b) means for determining VCO gain using values of input voltage and output frequency corresponding to the selected VCO operating curve;

(c) means for comparing the determined VCO gain with predetermined values of VCO gain; and (d) if the determined VCO gain is not within the predetermined values of VCO gain:

means for applying a sequence of gain digital control values to said VCO, wherein each gain digital control value corresponds to a different value of VCO gain;

means for selecting one of said gain digital control values responsive to said determined VCO gain, wherein said means for selecting one of said gain digital control values comprises at least one of incrementing and decrementing said gain digital control value by a least significant bit; and repeating steps (a) through (c).

* * * * *